(12) United States Patent
Lei et al.

(10) Patent No.: US 8,980,726 B2
(45) Date of Patent: Mar. 17, 2015

(54) SUBSTRATE DICING BY LASER ABLATION AND PLASMA ETCH DAMAGE REMOVAL FOR ULTRA-THIN WAFERS

(71) Applicant: Applied Materials, Inc., Santa Clara, CA (US)

(72) Inventors: Wei-Sheng Lei, San Jose, CA (US); Aparna Iyer, Sunnyvale, CA (US); Brad Eaton, Menlo Park, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/158,632

(22) Filed: Jan. 17, 2014

(65) Prior Publication Data

US 2014/0213042 A1    Jul. 31, 2014

Related U.S. Application Data

(60) Provisional application No. 61/757,030, filed on Jan. 25, 2013.

(51) Int. Cl.
*H01L 21/00* (2006.01)
*H01L 21/78* (2006.01)
(Continued)

(52) U.S. Cl.
CPC ............ *H01L 21/78* (2013.01); *H01L 21/0271* (2013.01); *H01L 21/3065* (2013.01); *H01L 21/3081* (2013.01); *H01L 21/31105* (2013.01); *H01L 21/31127* (2013.01); *H01L 21/6836* (2013.01); *H01L 2221/68327* (2013.01)

USPC ............................ 438/462; 438/463; 438/464

(58) Field of Classification Search
USPC .................................................. 438/460–465
See application file for complete search history.

(56) References Cited

U.S. PATENT DOCUMENTS

| 4,049,944 A | 9/1977 | Garvin et al. |
| 5,593,606 A | 1/1997 | Owen et al. |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Karen Kusumakar
(74) *Attorney, Agent, or Firm* — Blakely Sokoloff Taylor Zafman LLP

(57) ABSTRACT

Methods of dicing substrates having a plurality of ICs. A method includes forming a mask, patterning the mask with a femtosecond laser scribing process to provide a patterned mask with gaps, and ablating through an entire thickness of a semiconductor substrate to singulate the IC. Following laser-based singulation, a plasma etch is performed to remove a layer of semiconductor sidewall damaged by the laser scribe process. In the exemplary embodiment, a femtosecond laser is utilized and a 1-3 μm thick damage layer is removed with the plasma etch. Following the plasma etch, the mask is removed, rendering the singulated die suitable for assembly/packaging.

20 Claims, 7 Drawing Sheets

(51) Int. Cl.
*H01L 21/027* (2006.01)
*H01L 21/3065* (2006.01)
*H01L 21/308* (2006.01)
*H01L 21/311* (2006.01)
*H01L 21/683* (2006.01)

(56) References Cited

U.S. PATENT DOCUMENTS

| | | | |
|---|---|---|---|
| 6,057,180 | A | 5/2000 | Sun et al. |
| 6,174,271 | B1 | 1/2001 | Kosmowski |
| 6,306,731 | B1 | 10/2001 | Igarashi et al. |
| 6,407,363 | B2 | 6/2002 | Dunsky et al. |
| 6,465,158 | B1 | 10/2002 | Sekiya |
| 6,498,074 | B2 * | 12/2002 | Siniaguine et al. ........... 438/460 |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,927,973 | B2 | 4/2011 | Haji et al. |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2006/0024924 | A1 * | 2/2006 | Haji et al. ........... 438/464 |
| 2006/0043535 | A1 | 3/2006 | Hiatt |
| 2006/0205182 | A1 | 9/2006 | Soejima |
| 2009/0191690 | A1 * | 7/2009 | Boyle et al. ........... 438/462 |
| 2009/0255911 | A1 | 10/2009 | Krishnaswami et al. |
| 2010/0327291 | A1 * | 12/2010 | Preble et al. ........... 257/76 |
| 2011/0029124 | A1 * | 2/2011 | Boyle et al. ........... 700/121 |
| 2011/0312157 | A1 | 12/2011 | Lei et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

* cited by examiner

SUBSTRATE DICING BY LASER ABLATION AND PLASMA ETCH DAMAGE REMOVAL FOR ULTRA-THIN WAFERS

PRIORITY

This application is a Non-Provisional of, claims priority to, and incorporates by reference in its entirety for all purposes, the U.S. Provisional Patent Application No. 61/757,030 filed Jan. 25, 2013.

TECHNICAL FIELD

Embodiments of the present invention pertain to the field of semiconductor processing and, in particular, to masking methods for dicing substrates, each substrate having an integrated circuit (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting or insulating are utilized to form the ICs. These materials are doped, deposited, and etched using various well-known processes to simultaneously form a plurality of ICs, such as memory devices, logic devices, photovoltaic devices, etc., in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are mechanical scribing and sawing. For scribing, a diamond tipped scribe is moved across a substrate surface along preformed scribe lines. Upon the application of pressure, such as with a roller, the substrate separates along the scribe lines. For sawing, a diamond tipped saw cuts the substrate along the streets. For thin substrate singulation, such as 50-150 μms (μm) thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered metals (e.g., copper) in dicing along streets can create production issues or throughput limits. Finally, masking of the plasma dicing process may be problematic, depending on, inter alia, the thickness and top surface topography of the substrate, the selectivity of the plasma etch, and the materials present on the top surface of the substrate. As such, the masking materials selected may be problematic to remove once die singulation has been performed.

SUMMARY

One or more embodiments of the invention are directed to methods of dicing semiconductor wafers, each wafer having a plurality of integrated circuits (ICs) thereon.

According to one embodiment, a method of dicing a semiconductor substrate including a plurality of ICs involves forming a mask over the substrate covering and protecting the ICs. The method involves patterning the mask with a laser scribing process to provide a patterned mask with gaps, exposing regions of the substrate between the ICs. The method further involves ablating, with the laser scribing process, the entire thickness of the substrate within the gaps in the patterned mask to singulate the ICs. The method also involves plasma etching the substrate surfaces exposed by the laser scribing.

According to one embodiment, a method of dicing a semiconductor substrate including a plurality of ICs involves forming a mask over the substrate covering and protecting the ICs. The method involves patterning the mask with a laser scribing process to provide a patterned mask with gaps, exposing regions of the substrate between the ICs, and ablating, with the laser scribing process, the entire thickness of the substrate within the gaps in the patterned mask to singulate the ICs. The method further involves plasma etching the substrate surfaces exposed by the laser scribing.

In one embodiment, a system for dicing a semiconductor substrate including a plurality of ICs includes a laser scribe module to pattern a mask and ablate the entire thickness of a substrate between the ICs. The system includes a plasma etch module physically coupled to the laser scribe module, the plasma etch module configured to etch sidewalls of the substrate exposed by the laser module. The system also includes a robotic transfer chamber to transfer a laser scribed substrate between the laser scribe module and the plasma etch module.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
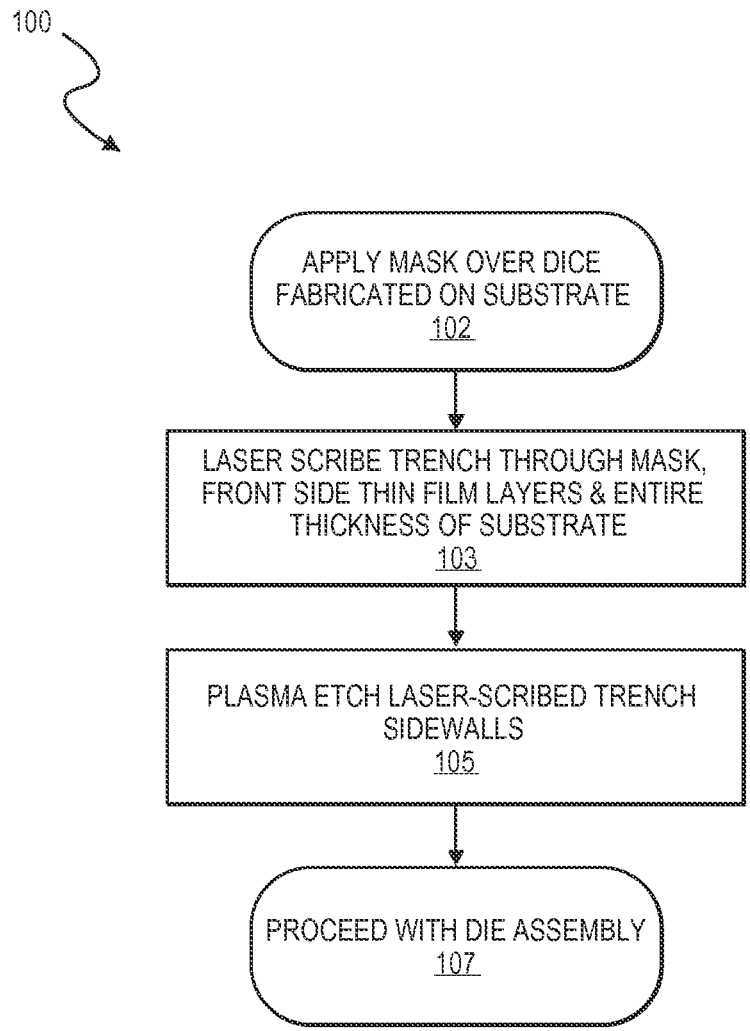
FIG. 1 is a flow diagram illustrating a laser ablation-plasma etch singulation method, in accordance with an embodiment of the present invention.

Methods of dicing substrates, each substrate having a plurality of ICs thereon, are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, a hybrid substrate or substrate dicing process involving an initial laser scribe and subsequent plasma etch is implemented with a mask for die singulation. The laser scribe process may be used to cleanly remove an unpatterned (i.e., blanket) mask layer, passivation layer, and subsurface thin film device layers, as well as ablating through the bulk of the substrate, such as through bulk single crystalline silicon, for singulation or dicing of chips, where the substrate semiconductor is sufficiently thin (e.g., 35 µm, or less). The plasma etch is then performed after singulation to etch exposed sidewalls of the semiconductor substrate, removing scribe damaged semiconductor material, and thereby improving the strength of the singulated die.

In accordance with an embodiment of the present invention, a combination of femtosecond laser scribing and plasma etching is used to dice a semiconductor substrate into individualized or singulated ICs and improve post-scribe die strength. In one embodiment, femtosecond laser scribing is an essentially, if not completely, non-equilibrium process. For example, the femtosecond-based laser scribing may be localized with a negligible thermal damage zone. In an embodiment, laser scribing is used to singulate ICs having ultra-low κ films (i.e., with a dielectric constant below 3.0). In one embodiment, direct writing with a laser eliminates a lithography patterning operation, allowing the masking material to be non-photosensitive. A plasma etch, such as an isotropic plasma etch, may then be performed, preferably in an integrated platform for lowest cost, to remove a target thickness of semiconductor from the ablated sidewalls of the semiconductor substrate.

Figure 2:
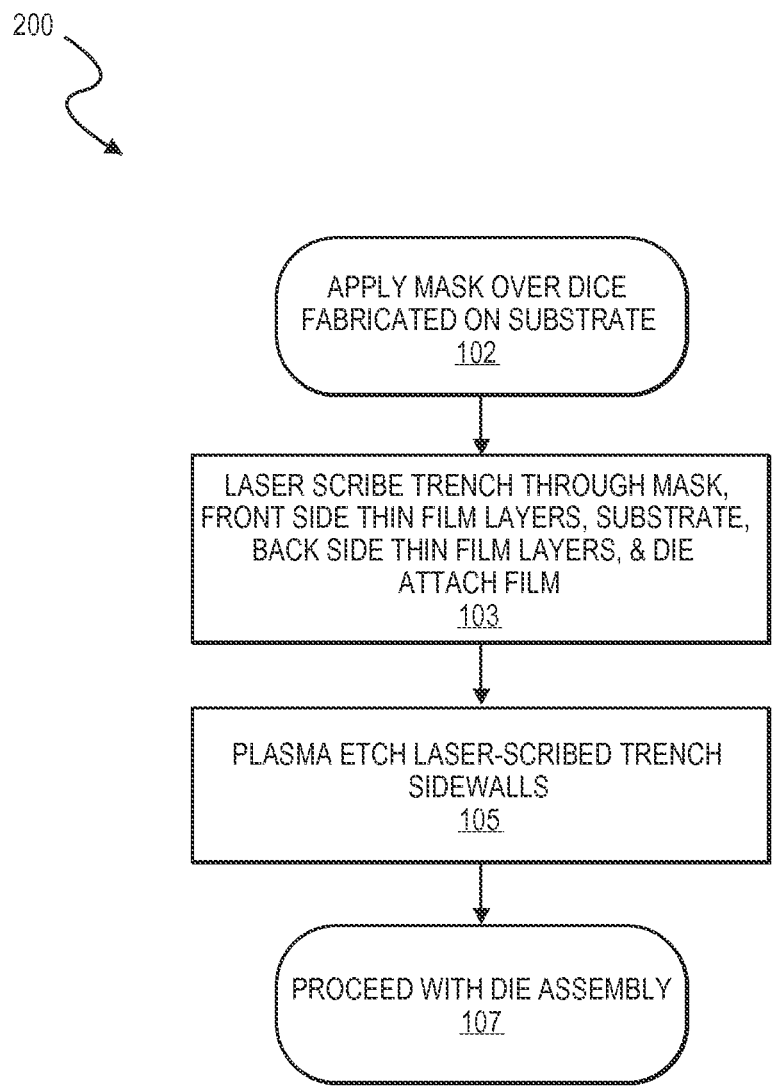
FIG. 2 is a flow diagram illustrating a laser ablation-plasma etch singulation method, in accordance with an embodiment of the present invention.

FIG. 1 is a flow diagram illustrating a hybrid laser ablation-plasma etch singulation process 100, in accordance with an embodiment of the present invention. FIG. 2 is a flow diagram illustrating a hybrid laser ablation-plasma etch singulation process 200, in accordance with an embodiment of the present invention. The singulation process 200 may be considered a special case of the method 100 where the substrate further includes backside thin films. FIGS. 4A-4D illustrate cross-sectional views of a substrate 406 including first and second ICs 425, 426 corresponding to the operations in methods 100 and 200, in accordance with an embodiment of the present invention.

Figure 4A:
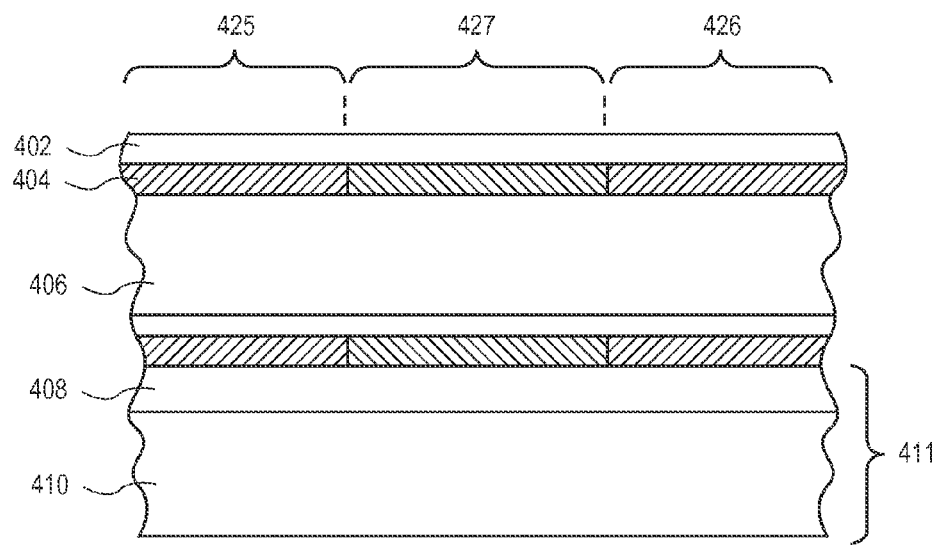
FIG. 4A illustrates a cross-sectional view of a semiconductor substrate including a plurality of ICs corresponding to operation 102 of the dicing method illustrated in FIG. 1, in accordance with an embodiment of the present invention.

Referring to operation 102 of FIG. 1, and corresponding FIG. 4A, a mask layer 402 is formed above a substrate 406. Generally, the substrate 406 is composed of any material suitable to withstand a fabrication process of the thin film device layers formed thereon. For example, in one embodiment, the substrate 406 is a group IV-based material such as, but not limited to, monocrystalline silicon, germanium or silicon/germanium. In another embodiment, the substrate 406 is a III-V material such as, e.g., a III-V material substrate used in the fabrication of light emitting diodes (LEDs). During device fabrication, the substrate 406 is relatively thick. For example, in one embodiment, the substrate 406 has a thickness in a range of 100 µm-800 µm. In the embodiment illustrated in FIG. 4A, the substrate 406 has been thinned to less than 35 µm (e.g., 20-35 µm), and the thinned substrate is supported by a carrier. For example, the thinned substrate 406 may be supported by a carrier 411 such as a backing tape 410 that is stretched across a frame (not illustrated) and adhered to a backside of the substrate 406 with a die attach film (DAF) 408.

In embodiments, the first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. In one embodiment, the width of the street 427 may be anywhere between 10 µm and 100 µm.

In embodiments, the mask layer 402 includes a water soluble (mask) material layer covering a top surface of the ICs 425, 426. In the illustrated embodiment, the mask layer 402 is formed over a device layer 404. The mask layer 402 also covers the intervening street 427 between the ICs 425, 426. The water soluble material layer is to provide protection to a top surface of the ICs 425, 426 during the hybrid laser scribing, plasma etch dicing method 100 (FIG. 1). In one embodiment, the mask layer 402 is unpatterned prior to the laser scribing operation 103, which involves using a laser to perform direct writing of scribe lines by ablating portions of the mask layer 402 disposed over the street 427.

Figure 5:
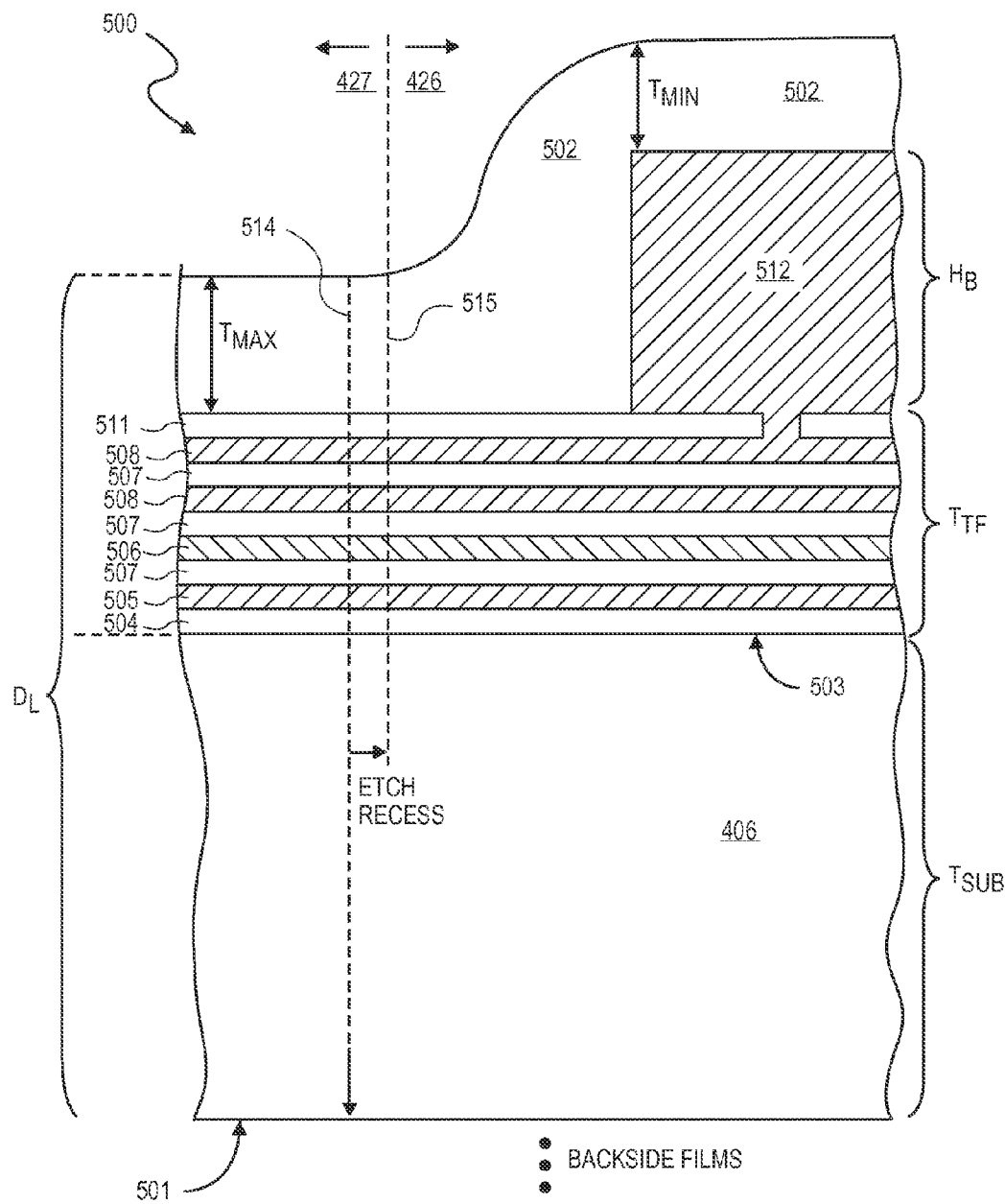
FIG. 5 illustrates a cross-sectional view of a water soluble mask applied to over a top surface and subsurface thin films of a substrate including a plurality of ICs, in accordance with embodiments of the present invention.

FIG. 5 illustrates an expanded cross-sectional view 500 of one exemplary embodiment including a water soluble layer 502 in contact with a top surface of the IC 426 and the street 427, in accordance with embodiments of the present invention. As shown in FIG. 5, the substrate 406 has a top surface 503 upon which thin film device layers are disposed, which is opposite a bottom surface 501 that interfaces with the DAF (e.g., the DAF 408 of FIG. 4A). Generally, the thin film device layer materials may include, but are not limited to, organic materials (e.g., polymers), metals (e.g., copper), or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) 507 such as carbon doped oxide (CDO) disposed there between. A top surface of the IC 426 includes a bump 512, typically copper, surrounded by a passivation layer 511, typically a polyimide (PI) or similar polymer. The bumps 512 and passivation layer 511 therefore make up a top surface of the IC with the thin film device layers forming subsurface IC layers. The bump 512 extends from a top surface of the passivation layer 511 by a bump height $H_B$ which in the exemplary embodiments ranges between 10 μm and 50 μm.

In an embodiment, the water soluble layer 502 is the mask layer 402, such that the mask layer 402 includes no other material layers. In other embodiments the water soluble layer 502 is only a first (bottom) layer of a multi-layered mask stack. Unlike other more conventional masking materials such as photoresist, inorganic dielectric hardmasks such as silicon dioxide, or silsesquioxanes, a mask including the water soluble layer 502 may be readily removed without damage to the underlying passivation layer 511 and/or bump 512. Where the water soluble layer 502 is the mask layer 402, the water soluble layer 502 is more than a mere contamination protection layer utilized during a conventional scribing process, and is instead to provide protection during the subsequent plasma etching of the streets. As such, the water soluble layer 502 is to be of sufficient thickness to survive the subsequent plasma etch process. In one embodiment, the water soluble layer 502 has a sufficient thickness to protect the bump 512 which, being copper, may be damaged, oxidized, or otherwise contaminated if exposed to an etchant plasma. The minimum thickness of the water soluble layer 502 is a function of the selectivity achieved by the subsequent plasma etch (e.g., operation 105 in FIG. 1). The plasma etch selectivity is dependent on at least both the material/composition of the water soluble layer 502 and the etch process employed. Generally, where the plasma utilized is an isotropic process having relatively low ion bombardment energy, etch selectivity over the mask material is improved, allowing for a thinner water soluble layer 502.

In an embodiment, the water soluble material is a water soluble polymer. Many such polymers are commercially available for applications such as laundry and shopping bags, green packaging, etc. However, selection of water soluble material for the present invention is complicated by stringent demands on maximum film thickness, etch resistance, thermal stability, mechanics of applying and removing the material from the substrate, and microcontamination. In the street, the maximum thickness $T_{max}$ of the water soluble layer 502 is limited by the ability of a laser to pattern through the masking by ablation. The water soluble layer 502 may be much thicker over the ICs 425, 426 and or edges of the street 427 where no street pattern is to be formed. As such, $T_{max}$ is generally a function of the optical conversion efficiency associated with the laser wavelength. As $T_{max}$ is associated with the street 427, street feature topography, street width, and the method of applying the water soluble layer 502 may be selected to achieve a desired $T_{max}$. In particular embodiments, the water soluble layer 502 has a thickness $T_{max}$ which is less than 20 μm and advantageously less than 10 μm with a thicker mask calling for multiple laser passes.

In an embodiment, the water soluble layer 502 is thermally stable to at least 60° C., preferably stable at 100° C., and ideally stable to 120° C. to avoid excessive crosslinking during the subsequent plasma etch process when the material's temperature may be elevated (e.g., to improve chemical etch rate of substrate semiconductor). Generally, excessive crosslinking adversely affects the solubility of the material, making post-etch removal of the mask layer more difficult. Depending on the embodiment, the water soluble layer 502 may be either wet applied over the substrate 406 to cover the passivation layer 511 and bump 512 or applied as a dry film laminate. For either mode of application, exemplary materials include, at least one of: poly(vinyl alcohol), poly(acrylic acid), poly(methacrylic acid), poly(acrylamide), or poly(ethylene oxide) with many other water soluble materials also readily available, particularly as a dry film laminate. Dry films for lamination may include the water soluble material only or may further include an adhesive layer that may also be water soluble or not. In a particular embodiment, the dry film includes a UV sensitive adhesive layer which has reduced adhesive bond strength upon UV exposure. Such UV exposure may occur during the subsequent plasma street etch.

Experimentally, poly(vinyl alcohol) (PVA) has been found to have an etch rate of between 1 μm/min and 1.5 μm/min for an exemplary anisotropic silicon plasma etch process (i.e., approximately 1:20 PVA:silicon, and an even lower etch rate for conditions improving the isotropic character of the plasma etch. The other exemplary materials may offer similar etch performance. As such, the minimum thickness over a top bump surface of an IC (e.g., $T_{min}$ in FIG. 5) may be determined by the required plasma etch recess, which is a function of the thickness of the laser scribe damage layer, as measured from the ablation sidewall. In an exemplary embodiment where a femtosecond laser is employed, the water soluble layer 502 has a minimum thickness of less than 10 μm, and advantageously less than 5 μm, which provides sufficient margin for a recessing between 1-3 μm of the substrate (e.g., etch recess distance demarked between dotted lines 514 and 515 in FIG. 5) with a plasma etch process, as described further elsewhere herein.

Figure 4B:
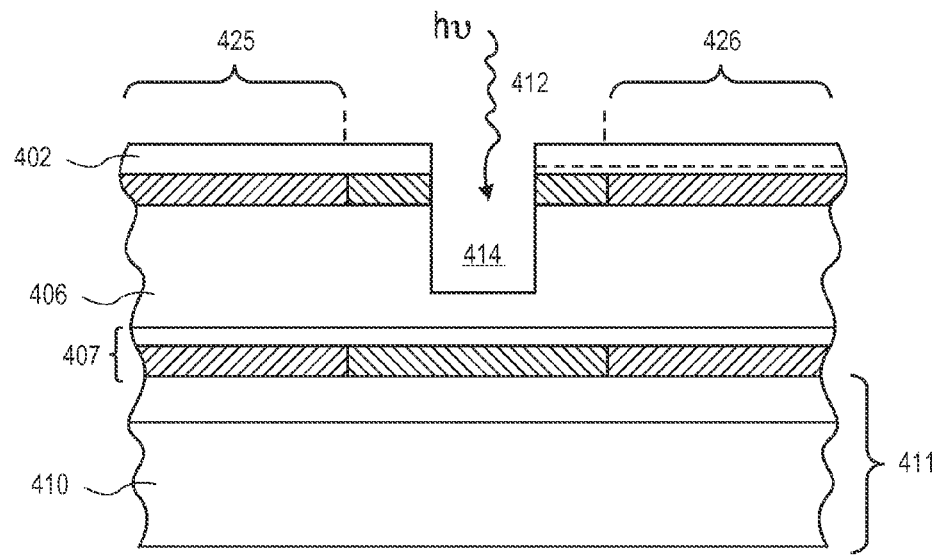
FIG. 4B illustrates a cross-sectional view of a semiconductor substrate including a plurality of ICs corresponding to operation 103 of the dicing method illustrated in FIG. 1, in accordance with an embodiment of the present invention.

At operation 103 of method 100, and corresponding FIG. 4B, the mask layer 402 is patterned by ablation with a laser scribing process forming trenches 412, extending through the subsurface thin film device layers, and exposing regions of the substrate 406 between the ICs 425, 426. As such, the laser scribing process is used to ablate the thin film material of the streets 427 originally formed between the ICs 425, 426. In accordance with an embodiment of the present invention, patterning the mask layer 402 with the laser-based scribing process includes forming trenches 414 partially into the regions of the substrate 406 between the ICs 425, 426, as depicted in FIG. 4B.

In the exemplary ultra-thin wafer embodiments where the thickness of the substrate 406 is 35 µm, or less, the total laser scribing depth $D_L$ is typically less than 50 µm deep, depending on the frontside thin film thickness $T_F$ of the passivation layer 511 and subsurface thin film device layers, and thickness $T_{max}$ of the water soluble layer 502 (and any additional material layer included as part of the mask 502).

In an embodiment, the mask layer 502 is patterned with a laser having a pulse width (duration) in the femtosecond range (i.e., $10^{-15}$ seconds), referred to herein as a femtosecond laser. Laser parameters selection, such as pulse width, may be critical to developing a successful laser scribing and dicing process that minimizes chipping, microcracks and delamination in order to achieve clean laser scribe cuts. A laser frequency in the femtosecond range advantageously mitigates heat damage issues relative longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond-source. With nanosecond or picosecond laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

Parameters for a femtosecond laser-based process may be selected to have substantially the same ablation characteristics for the inorganic and organic dielectrics, metals, and semiconductors. For example, the absorptivity/absorptance of silicon dioxide is non-linear and may be brought more in-line with that of organic dielectrics, semiconductors, and metals. In one embodiment, a high intensity and short pulse width femtosecond-based laser process is used to ablate a stack of thin film layers including a silicon dioxide layer and one or more of an organic dielectric, a semiconductor, or a metal. In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 450 femtoseconds, although preferably in the range of 50 femtoseconds to 500 femtoseconds.

In certain embodiments, the laser emission spans any combination of the visible spectrum, the ultra-violet (UV), and/or infra-red (IR) spectrums for a broad or narrow band optical emission spectrum. Even for femtosecond laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific embodiment, a femtosecond laser suitable for semiconductor substrate or substrate scribing is based on a laser having a wavelength of approximately less than or equal to 540 nanometers, although preferably in the range of 540 nanometers to 250 nanometers. In a particular embodiment, pulse widths are less than or equal to 500 femtoseconds for a laser having a wavelength less than or equal to 540 nanometers. However, in an alternative embodiment, dual laser wavelengths (e.g., a combination of an IR laser and a UV laser) are used.

In one embodiment, the laser and associated optical pathway provide a focal spot at the work surface approximately in the range of 3 µm to 15 µm, though advantageously in the range of 5 µm to 10 µm. The spatial beam profile at the work surface may be a single mode (Gaussian) or have a beam shaped top-hat profile. In an embodiment, the laser source has a pulse repetition rate approximately in the range of 300 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in a single pass only, or in multiple passes, but is advantageously no more than two passes. The laser may be applied either in a train of single pulses at a given pulse repetition rate or a train of pulse bursts. In an embodiment, the kerf width of the laser beam generated is approximately in the range of 2 µms to 15 µm, although in silicon substrate scribing/dicing preferably approximately in the range of 6 µm to 10 µm, as measured at a device/silicon interface.

Figure 4C:
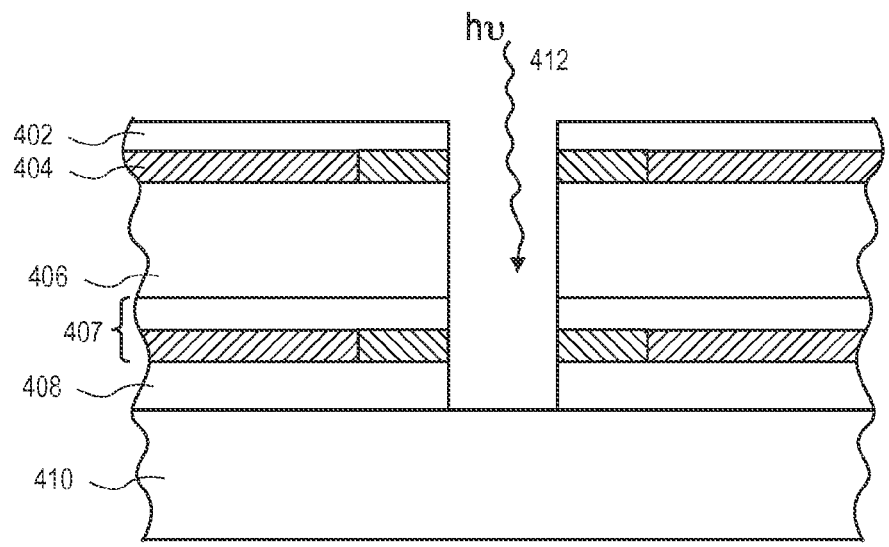
FIG. 4C illustrates a cross-sectional view of a semiconductor substrate including a plurality of ICs corresponding to operation 103 of the dicing method illustrated in FIG. 1, in accordance with an embodiment of the present invention.
Figure 4D:
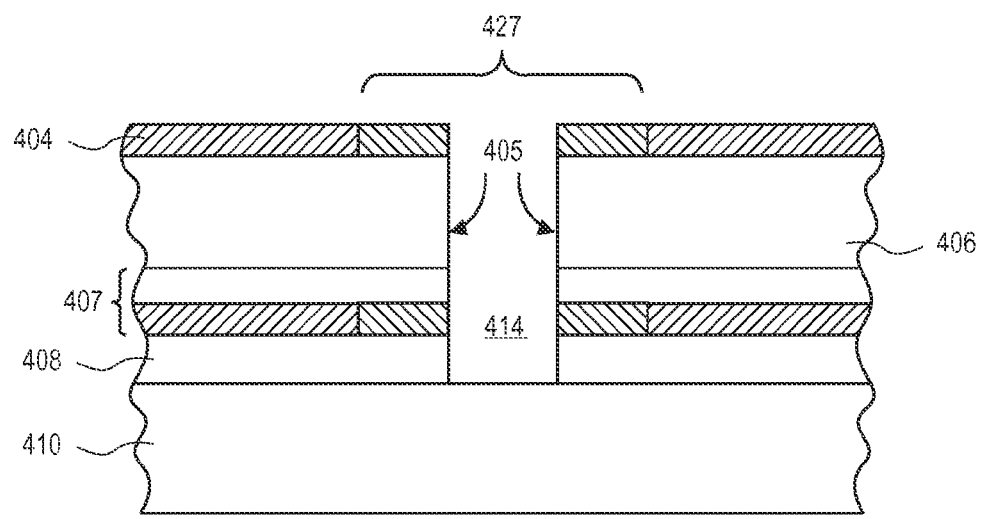
FIG. 4D illustrates a cross-sectional view of a semiconductor substrate including a plurality of ICs corresponding to operation 105 of the dicing method illustrated in FIG. 1, in accordance with an embodiment of the present invention.

Returning to FIGS. 1 and 4C, the substrate 406 is ablated through the trenches 412 in the patterned mask layer 402 to singulate the ICs 426. In accordance with an embodiment of the present invention, ablating the substrate 406 includes ablating the trenches 412 with the femtosecond-based laser scribing process entirely through substrate 406, as depicted in FIG. 4C. FIG. 2 is a flow diagram illustrating a laser ablation-plasma etch singulation method 200, in accordance with an embodiment of the present invention where the ICs include backside thin film layers as well as the frontside thin film layers described elsewhere herein (e.g., in the context of FIG. 5). Generally, the backside thin film layers may include any of the materials described for the frontside thin films, such as but not limited to metal layers (e.g., copper) and dielectric layers (e.g., silicon dioxide, low-κ dielectrics, etc. For such embodiments, the backside thin film layers 407 are also ablated during the laser scribing operation 103, as is further shown in FIG. 4C. In further embodiments, the DAF 408 is also ablated during the laser scribing operations (e.g., by the femtosecond laser) to expose the backing tape 410. Hence, with a sufficiently thin semiconductor substrate, both frontside and backside thin film layers, which are relatively difficult to plasma etch, may be completely ablated during the laser scribing process at operation 103.

Following the laser scribing process(es), the IC dice are singulated and the methods 100 and 200 proceed with the plasma etch operation 105. At operation 105, as further depicted in FIG. 4D, the plasma etch removes scribe damaged substrate semiconductor. The singulated dies need sufficiently high die break strengths to ensure reliable die pick and place and subsequent assembly processes. It has been found that the rough, damaged sidewalls present following the laser ablation operation 103 unacceptably reduce die break strength. However, it has also been found that the damage layer in a silicon substrate for a femtosecond laser is less than 3 μm and that a higher die break strength can be achieved by performing the plasma etch operation 105 to remove a comparable thickness of semiconductor from sidewalls 405 exposed by the trench 412. Referring again to FIG. 5, an amount of recess may be achieved from the ablated trench surface 514 to arrive at a clean etched surface 515. In embodiments, the etch recess is at least 1 μm and preferably between 1 and 3 μm. Notably, had a nanosecond laser been employed at operation 103, the longer pulses would result in damage layers in the semiconductor substrate exceeding 7 μm, which would be more difficult to remove during the plasma etch operation 105, and may require excessive amounts of undercut (leading to die loss due to film delamination and/or particle issues).

In one embodiment, a high-density plasma source operating at high powers may be used for the plasma etching operation 105. Exemplary powers range between 3 kW and 6 kW, or more. An example of a process chamber suitable to perform such a plasma etch process is the Applied Centura® Silvia™ Etch system available from Applied Materials of Sunnyvale, Calif., USA. The Applied Centura® Silvia™ Etch system combines capacitively and inductively coupled RF generators, which enables much more independent control of the ion density and ion energy than is possible with capacitive coupling or inductive only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. In alternative embodiments, any conventional downstream plasma source is utilized to provide reactive etching species to the substrate disposed within an etch chamber.

In one exemplary embodiment, the plasma etch operation 105 entails an isotropic etching process, for example employing a fluorine or chlorine-based chemistry, which is preferably non-polymerizing (e.g., $NF_3$, $SF_6$, $Cl_2$ or $SiF_4$, etc. for the exemplary silicon substrate). Vertical etch rates of 10 μm/min are expected with lateral etch rate being between 50 and 100% of that, depending on process conditions. As such, etch time is generally within 10 to 90 sec, depending on the desired undercut and isotropic character of the plasma etch. In embodiments, the wafer temperature during the plasma etch operation 105 is elevated to at least 50° C., and advantageously between 70° C. and 80° C. for a least a portion of the plasma etch process for highest chemical etch rate, although it is advantageous to maintain the mask layer at a temperature below 100° C. to prevent extensive crosslinking in the mask material and subsequent difficulty in mask removal. At temperatures below 100° C., water solubility of the mask is advantageously maintained.

Depending on the capabilities of the etch chamber, plasma heating (e.g., through incorporation of sufficient ion bombardment to achieve a desired wafer temperature), and/or chuck heating may be utilized. For embodiments with plasma heating, ion bombardment may be provided in the form of a modified deep silicon etch. Ion bombardment may also be advantageous for removing thermally damaged semiconductor. Hence, chambers with multiple RF sources may be superior to downstream sources incapable of providing ions to the etch chamber. To increase the isotropic character of a deep silicon etch process, fewer, if any, protective polymer deposition cycles employing a polymerizing $C_xF_y$ gas such as, but not limited to, $C_4F_6$ or $C_4F_8$ are interleaved over time with etch cycles, than would be typical for a conventional anisotropic deep silicon etch. For example, in embodiments the duty cycle between etch and deposition processes is advantageously much less than 1:1 (e.g., 1:0.25).

Following the plasma etch operation 105, the mask layer 402 is removed. In an embodiment, the mask is first washed off with water, for example with a pressurized jet of deionized water or by submergence in an ambient or heated water bath. At operation 107, methods 100 and 200 are completed with conventional die assembly techniques.

Figure 3:
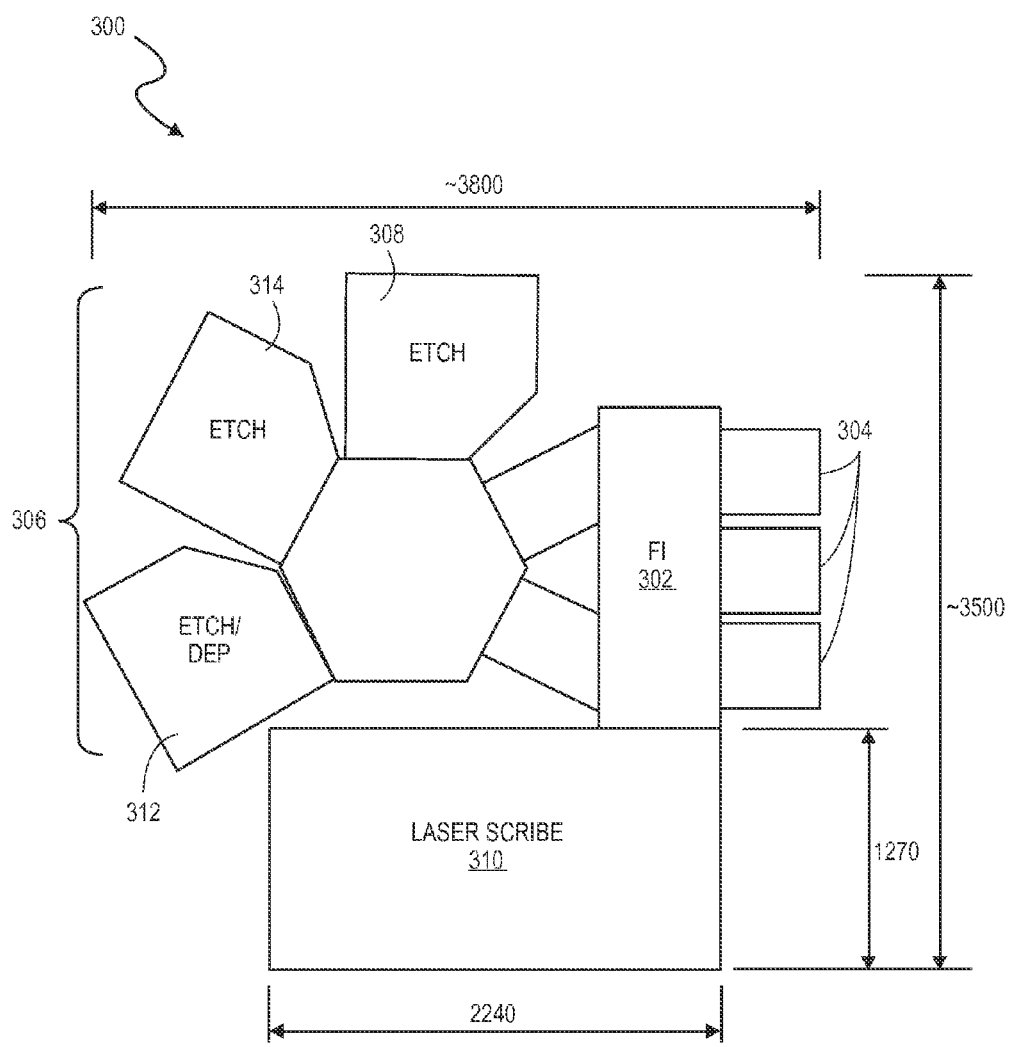
FIG. 3 illustrates a plan view schematic of an integrated dicing system in accordance with an embodiment of the present invention.

FIG. 3 depicts a process tool 300 configured to perform the singulation methods 100 and 200 in an integrated manner. Referring to FIG. 3, a process tool 300 includes a factory interface 302 (FI) having a plurality of load locks 304 coupled therewith. A cluster tool 306 is coupled with the factory interface 302. The cluster tool 306 includes one or more plasma etch chambers, such isotropic plasma etch chambers, anisotropic etch chambers, multi-RF source chambers that are tunable for various degrees of isotropic etch character, and/or dep/etch chambers suitable for deep silicon etching. Multiple etch chambers 308, 312, 314 may be included for throughput matching to a laser scribe apparatus 310, also coupled to the factory interface 302. The overall footprint of the process tool 300 is, in one embodiment, approximately 3500 millimeters (3.5 meters) by approximately 3800 millimeters (3.8 meters), as depicted in FIG. 3.

In an embodiment, the laser scribe apparatus 310 houses a femtosecond-based laser. The femtosecond-based laser is suitable for performing a laser ablation portion of a hybrid laser and etch singulation process, such as the laser ablation processes described above. In one embodiment, a movable stage is also included in laser scribe apparatus 310, the movable stage configured for moving a wafer or substrate (or a carrier thereof) relative to the femtosecond-based laser. In a specific embodiment, the femtosecond-based laser is also movable. The overall footprint of the laser scribe apparatus 310 may be, in one embodiment, approximately 2240 millimeters by approximately 1270 millimeters, as depicted in FIG. 3.

In an embodiment, the one or more plasma etch chambers 308 is configured for etching a wafer or substrate through the gaps in a patterned mask to singulate a plurality of integrated circuits. In one such embodiment, the one or more plasma etch chambers 308 is configured to perform a deep silicon etch process. In a specific embodiment, each of the one or more plasma etch chambers 308, 312, 314 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 308 to facilitate high (lateral/isotropic) silicon etch rates with sufficient bias for ion bombardment (e.g., for plasma heating and/or removal of thermally damaged semiconductor). In an embodiment, more than one such etch chamber is included in the cluster tool 306 portion of process tool 300 to enable high manufacturing throughput of the singulation or dicing process.

The factory interface 302 may be a suitable atmospheric port to interface between an outside manufacturing facility with the laser scribe apparatus 310 and the cluster tool 306. The factory interface 302 may include robots with arms or blades for transferring wafers (or carriers thereof) from storage units (such as front opening unified pods) into either cluster tool 306 or laser scribe apparatus 310, or both.

Cluster tool 306 may include other chambers suitable for performing functions in a method of singulation. For example, in one embodiment, in place of an additional etch chamber, a deposition chamber 312 is included. The deposition chamber 312 may be configured for mask deposition on or above a device layer of a wafer or substrate prior to laser scribing of the wafer or substrate, e.g., by a uniform spin-on process. In one such embodiment, the deposition chamber 312 is suitable for depositing a uniform layer with a conformality factor within approximately 10%.

Figure 6:
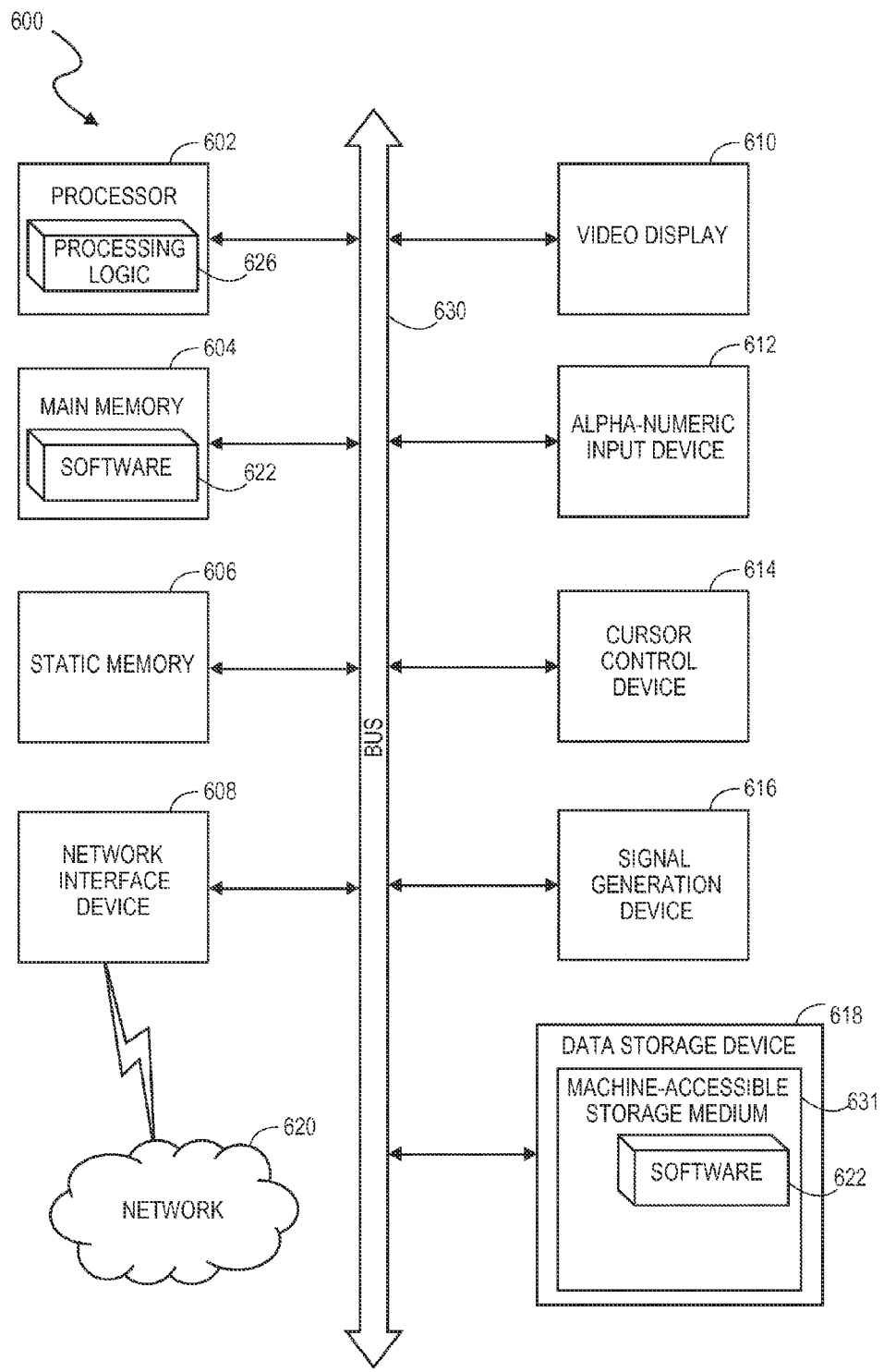
FIG. 6 illustrates a block diagram of an exemplary computer system which controls automated performance of one

FIG. 6 illustrates a computer system 600 within which a set of instructions, for causing the machine to execute one or more of the scribing methods discussed herein may be executed. The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, etc. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations and steps discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A method of dicing a semiconductor substrate comprising a plurality of integrated circuits (ICs), the method comprising:
    forming a mask over the substrate covering and protecting the ICs;
    patterning the mask with a laser scribing process to provide a patterned mask with gaps, exposing regions of the substrate between the ICs;
    ablating, with the laser scribing process, the entire thickness of the substrate within the gaps in the patterned mask to singulate the ICs; and
    plasma etching substrate surfaces exposed by the laser scribing process.

2. The method of claim 1, wherein the plasma etching includes isotropically etching a sidewall of the scribed substrate.

3. The method of claim 1, wherein the thickness of the substrate is less than 35 μm.

4. The method of claim 1, wherein the substrate includes at least one of a backside metal layer and a backside dielectric layer disposed on a backside of the semiconductor substrate, opposite the mask, and wherein the method further comprises ablating, with the laser scribing process, the backside metal layer or the backside dielectric layer.

5. The method of claim 1, wherein the substrate is attached to a carrier with a die attach film (DAF), and wherein the method further comprises ablating, with the laser scribing process, the entire thickness of the DAF.

6. The method of claim 1, wherein the mask comprises a water soluble polymer.

7. The method of claim 6, wherein the water soluble polymer comprises at least one of: poly(vinyl alcohol), poly (acrylic acid), poly(methacrylic acid), poly(acrylamide), or poly(ethylene oxide) in contact with a top surface of a passivation layer of the ICs.

8. The method of claim 1, wherein the patterning the mask and scribing through the substrate is performed with a femtosecond laser scribing process utilizing a laser having a wavelength less than or equal to 540 nanometers and a laser pulse width less than or equal to 500 femtoseconds.

9. The method of claim 1, wherein plasma etching the substrate surfaces further comprises removing between 1 and 3 μm of semiconductor from substrate sidewalls exposed by the laser scribing process.

10. The method of claim 1, wherein plasma etching the substrate surfaces comprises generating a plasma of an etchant gas including at least one of: $NF_3$, $SF_6$, $Cl_2$, and $SiF_4$.

11. A method of dicing a silicon substrate comprising a plurality of integrated circuits (ICs), the method comprising:
 forming a water soluble mask layer over the silicon substrate, the water soluble mask layer covering a region of the substrate to be removed by the dicing;
 patterning the water soluble mask layer, and ablating through a thickness of the substrate with a femtosecond laser to expose sidewalls of the silicon substrate between the ICs and singulate the ICs; and
 plasma etching the exposed sidewalls of the silicon substrate to remove scribe damage.

12. The method of claim 11, wherein the plasma etching includes isotropically etching the sidewalls of the scribed substrate.

13. The method of claim 11, wherein the thickness of the substrate is less than 35 μm and wherein the plasma etching removes 1-3 μm of semiconductor from the sidewalls of the scribed substrate.

14. The method of claim 11, wherein the substrate includes at least one of a backside metal layer and a backside dielectric layer disposed on a backside of the substrate, opposite the water soluble mask layer, and wherein the method further comprises ablating, with the femtosecond laser, the backside metal layer or the backside dielectric layer.

15. The method of claim 11, wherein the substrate is attached to a carrier with a die attach film (DAF), and wherein the method further comprises ablating, with the femtosecond laser, the entire thickness of the DAF.

16. The method of claim 11, wherein the water soluble mask layer comprises at least one of: poly(vinyl alcohol), poly(acrylic acid), poly(methacrylic acid), poly(acrylamide), or poly(ethylene oxide) in contact with a top surface of a passivation layer of the ICs.

17. A system for dicing a semiconductor substrate comprising a plurality of ICs, the system comprising:
 a laser scribe module to pattern a mask and ablate the entire thickness of a substrate between the ICs;
 a plasma etch module physically coupled to the laser scribe module, the plasma etch module configured to etch sidewalls of the substrate exposed by the laser scribe module; and
 a robotic transfer chamber to transfer a laser scribed substrate between the laser scribe module and the plasma etch module.

18. The system of claim 17, wherein the laser scribe module comprises a femtosecond laser having a wavelength less than or equal to 540 nanometers and a pulse width of less than or equal to 500 femtoseconds.

19. The system of claim 17, wherein the plasma etch module includes a capacitively coupled RF generator and an inductively coupled RF generator with a combined RF power range being between 3 kW and 6 kW.

20. The system of claim 18, further comprising an etch source gas coupled to the plasma etch module, the etch source gas consisting of: $NF_3$, $SF_6$, $Cl_2$, or $SiF_4$.

* * * * *